(12) United States Patent
Kang et al.

(10) Patent No.: US 11,876,012 B2
(45) Date of Patent: Jan. 16, 2024

(54) METHOD OF MANUFACTURING SEMICONDUCTOR PACKAGE SUBSTRATE AND SEMICONDUCTOR PACKAGE SUBSTRATE MANUFACTURED USING THE SAME

(71) Applicant: HAESUNG DS CO., LTD., Changwon-si (KR)

(72) Inventors: Sung Il Kang, Gimhae-si (KR); In Seob Bae, Changwon-si (KR); Jea Won Kim, Changwon-si (KR)

(73) Assignee: HAESUNG DS CO., LTD., Changwon-si (KR)

( * ) Notice: Subject to any disclaimer, the term of this patent is extended or adjusted under 35 U.S.C. 154(b) by 295 days.

(21) Appl. No.: 17/018,596

(22) Filed: Sep. 11, 2020

(65) Prior Publication Data

US 2020/0411362 A1    Dec. 31, 2020

Related U.S. Application Data

(62) Division of application No. 16/117,923, filed on Aug. 30, 2018, now Pat. No. 10,811,302.

(30) Foreign Application Priority Data

Aug. 31, 2017 (KR) .......................... 10-2017-0111038

(51) Int. Cl.
*H01L 23/48* (2006.01)
*H01L 21/762* (2006.01)
(Continued)

(52) U.S. Cl.
CPC .. *H01L 21/76224* (2013.01); *H01L 21/76802* (2013.01); *H01L 23/481* (2013.01); *H01L 23/498* (2013.01)

(58) Field of Classification Search
CPC ............................................ H01L 23/481–498
See application file for complete search history.

(56) References Cited

U.S. PATENT DOCUMENTS

| 5,664,325 A | 9/1997 | Fukutomi et al. |
| 6,522,555 B2 | 2/2003 | Hirano et al. |

(Continued)

FOREIGN PATENT DOCUMENTS

| CN | 1574300 A | 2/2005 |
| CN | 101072474 A | 11/2007 |

(Continued)

OTHER PUBLICATIONS

Reconsideration Report before Appeal from JP Patent Application No. 2018-152247 dated Aug. 26, 2021; 9 pgs.

(Continued)

*Primary Examiner* — Hoa B Trinh
(74) *Attorney, Agent, or Firm* — Schwabe Williamson & Wyatt

(57) ABSTRACT

A method of manufacturing a semiconductor package substrate includes forming a trench and a post by etching an upper surface of a base substrate including a conductive material, filling the trench with a resin, removing the resin exposed to outside of the trench such that an upper surface of the post and an upper surface of the resin are at same level, forming a conductive layer on an entire area of the upper surface of the post and the upper surface of the resin, and forming a circuit wiring including an upper circuit wiring and a lower circuit wiring by simultaneously patterning the conductive layer and a lower surface of the base substrate.

21 Claims, 3 Drawing Sheets

(51) Int. Cl.
*H01L 21/768* (2006.01)
*H01L 23/498* (2006.01)

(56) References Cited

U.S. PATENT DOCUMENTS

| | | | |
|---|---|---|---|
| 7,190,057 | B2 | 3/2007 | Seki et al. |
| 7,588,835 | B2 | 9/2009 | Yamashita et al. |
| 7,707,716 | B2 | 5/2010 | Song et al. |
| 7,780,836 | B2 | 8/2010 | Chinda et al. |
| 8,065,794 | B2 | 11/2011 | En et al. |
| 8,828,247 | B2 | 9/2014 | Kwon et al. |
| 8,946,906 | B2 | 2/2015 | Maeda |
| 9,368,450 | B1 | 6/2016 | Gu |
| 9,460,986 | B2 | 10/2016 | Kang et al. |
| 9,620,446 | B2 | 4/2017 | Shimizu et al. |
| 9,780,043 | B2 | 10/2017 | Kaneda et al. |
| 2004/0150080 | A1 | 8/2004 | Lee et al. |
| 2010/0140807 | A1* | 6/2010 | Kobayashi ........ H01L 21/76829 556/412 |
| 2012/0104562 | A1 | 5/2012 | Pagalia |
| 2013/0048358 | A1* | 2/2013 | Kanki ................ H01L 23/5389 174/250 |
| 2015/0194323 | A1* | 7/2015 | Kang ................ H01L 23/49827 216/14 |
| 2017/0299965 | A1* | 10/2017 | Hashimoto ........... H01L 29/786 |

FOREIGN PATENT DOCUMENTS

| | | |
|---|---|---|
| CN | 101137768 A | 3/2008 |
| CN | 103025068 A | 4/2013 |
| CN | 104766832 A | 7/2015 |
| JP | 2001-332860 A | 11/2001 |
| JP | 2004241442 A | 8/2004 |
| JP | 2004247668 A | 9/2004 |
| JP | 2006093303 A | 4/2006 |
| JP | 3830726 B2 | 10/2006 |
| JP | 2009-016518 A | 1/2009 |
| JP | 2014216599 A | 11/2014 |
| JP | 2015165545 A | 9/2015 |
| JP | 2016082151 A | 5/2016 |
| JP | 2016111297 A | 6/2016 |
| JP | 2016186964 A | 10/2016 |
| JP | 2017-073441 A | 4/2017 |
| KR | 20090103605 A | 10/2009 |
| KR | 20150083401 A | 7/2015 |

OTHER PUBLICATIONS

Notice of Reasons for Refusal dated Apr. 4, 2022 for corresponding JP Patent Application No. 2018-152247 including English translation; pp. 1-15.

First Office Action dated Nov. 24, 2021 for corresponding CN Patent Application No. 201811000316.5 including English translation; pp. 1-15.

3rd Office Action dated Apr. 28, 2020 for corresponding Taiwanese Patent Application No. 107126782 including English summary of the Office Action.

Notice of Reasons for Refusal dated May 25, 2020 for corresponding Japanese Patent Application No. 2018-152247 including English translation of the Notice.

* cited by examiner

METHOD OF MANUFACTURING SEMICONDUCTOR PACKAGE SUBSTRATE AND SEMICONDUCTOR PACKAGE SUBSTRATE MANUFACTURED USING THE SAME

CROSS-REFERENCE TO RELATED APPLICATION

This application is a divisional of U.S. patent application Ser. No. 16/117,923, filed on Aug. 30, 2018, entitled "METHOD OF MANUFACTURING SEMICONDUCTOR PACKAGE SUBSTRATE AND SEMICONDUCTOR PACKAGE SUBSTRATE MANUFACTURED USING THE SAME," which claims priority to KR Application No. 10-2017-0111038, filed Aug. 31, 2017, the entire disclosures of each of these applications are hereby incorporated by reference in their entireties and for all purposes.

BACKGROUND

1. Field

One or more embodiments relate to a method of manufacturing a semiconductor package substrate and a semiconductor package substrate manufactured using the same, and more particularly, to a method of manufacturing a semiconductor package substrate having fast response, superior heat dissipation characteristics, and circuit redistribution on both of upper and lower surfaces, and a semiconductor package substrate manufactured using the method.

2. Description of the Related Art

Semiconductor devices are packaged and arranged in a semiconductor package substrate. A semiconductor package substrate used for packaging includes fine circuit patterns and/or I/O terminals. As the performance and/or density of semiconductor devices increases and electronic apparatuses including semiconductor devices become more compact and have increasingly high performance, a fine circuit pattern of the semiconductor package substrate has a narrow line width and high complexity.

In the manufacturing of a semiconductor package substrate according to the related art, a through hole is formed by using a copper clad laminate (CCL) stacked with a copper foil, and an inner surface of the through hole is plated to electrically connect an upper copper foil to a lower copper foil. Then, the upper copper foil and the lower copper foil are patterned using a photoresist, thereby manufacturing a semiconductor package substrate. However, as the electrical and thermal characteristics of the semiconductor package substrate according to the related art deteriorate rapidly, such a semiconductor package substrate is not suitable for a structure with fast response and superior heat dissipation characteristics.

SUMMARY

One or more embodiments include a method of manufacturing a semiconductor package substrate having fast response, superior heat dissipation characteristics, and circuit redistribution on both of upper and lower surfaces, and a semiconductor package substrate manufactured using the method Additional aspects will be set forth in part in the description which follows and, in part, will be apparent from the description, or may be learned by practice of the presented embodiments.

According to one or more embodiments, a method of manufacturing a semiconductor package substrate includes forming a trench and a post by etching an upper surface of a base substrate including a conductive material, filling the trench with a resin, removing the resin exposed to outside of the trench such that an upper surface of the post and an upper surface of the resin are at same level, forming a conductive layer on an entire area of the upper surface of the post and the upper surface of the resin, and forming a circuit wiring including an upper circuit wiring and a lower circuit wiring by simultaneously patterning the conductive layer and a lower surface of the base substrate.

The conductive layer may be formed by stacking a first conductive layer and a second conductive layer, and a thickness of the first conductive layer may be less than a thickness of the second conductive layer.

The first conductive layer may be formed by a sputtering method.

The first conductive layer may be formed by a sputtering method and the second conductive layer may be formed by an electroplating method.

The method may further include, before the forming of the conductive layer, performing a surface treatment on the resin.

The method may further include, before the forming of the circuit wiring, entirely etching a lower surface of the base substrate.

The method may further include, after the forming of the circuit wiring, forming a circuit protection layer in at least a part of the circuit wiring.

Each of the resin and the circuit protection layer may include a photosensitive resin.

The method may further include, after the forming of the circuit protection layer, forming a plating layer or an organic coating layer on an exposed circuit pattern.

According to one or more embodiments, a semiconductor package substrate filled with resin includes an upper circuit wiring disposed on an upper surface of the resin, a lower circuit wiring disposed on a lower surface of the resin, and a post penetrating the resin and connecting the upper circuit wiring to the lower circuit wiring, wherein the upper circuit wiring is separate from the post, and at least a part of the lower circuit wiring is integrally formed with the post.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
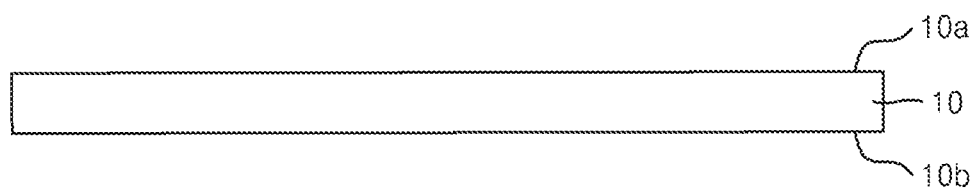
FIGS. 1 to 8 are cross-sectional views schematically illustrating processes of a method of manufacturing a semiconductor package substrate according to an embodiment.

As the disclosure allows for various changes and numerous embodiments, embodiments will be illustrated in the drawings and described in detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure.

In the description of the present disclosure, certain detailed explanations of the related art are omitted when it is deemed that they may unnecessarily obscure the essence of the disclosure.

In the embodiments below, it will be understood that when a component, such as a layer, a film, a region, or a plate, is referred to as being "on" another component, the component can be directly on the other component or intervening components may be present thereon. Also, Sizes of components in the drawings may be exaggerated for convenience of explanation. In other words, since sizes and thicknesses of components in the drawings are arbitrarily illustrated for convenience of explanation, the following embodiments are not limited thereto.

FIGS. 1 to 8 are cross-sectional views schematically illustrating processes of a method of manufacturing a semiconductor package substrate according to an embodiment According to a method of manufacturing a semiconductor package substrate according to the present embodiment, as illustrated in FIG. 1, a base substrate 10 including a conductive material is prepared. The base substrate 10 may have a flat plate shape and include an electrically conductive material. In an embodiment, the electrically conductive material may include, for example, Cu, a Cu alloy such as Cu—Sn, Cu—Zr, Cu—Fe, or Cu—Zn, Fe, or a Fe alloy such as Fe—Ni or Fe—Ni—Co.

Figure 2:
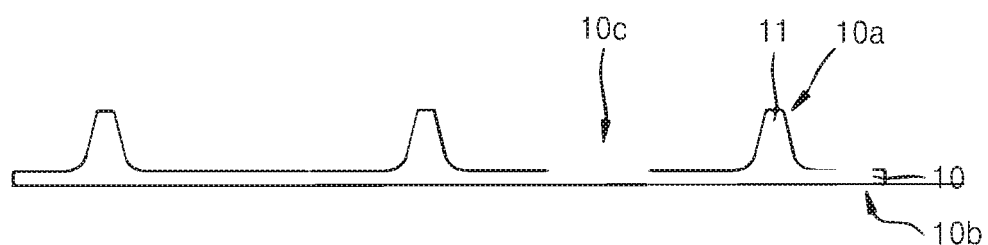

After the base substrate 10 including a conductive material is prepared, a trench 10c and a post 11 are formed on an upper surface 10a opposite a lower surface 10b of the base substrate 10, as illustrated in FIG. 2. The trench 10c may not completely penetrate the base substrate 10. The post 11 may connect the upper surface 10a to the lower surface 10b of the base substrate 10, and may perform later a function of electrically connecting an upper circuit wiring formed on the upper surface 10a to a lower circuit wiring formed on the lower surface 10b of the base substrate 10. The post 11 may be formed between a plurality of trenches 10c. Furthermore, although it is not illustrated in the cross-sectional view of FIG. 2, the post 11 may have a shape extending in one direction or a tortuous shape in a plan view.

The trench 10c and the post 11 may be formed by etching. In an embodiment, a dry film resist (DFR) of a photosensitive material may be laminated on the upper surface 10a of the base substrate 10, and exposure and development processes may be performed with respect to the laminated DFR, thereby exposing only a portion where the trench 10c of the base substrate 10 is to be formed. Then, a portion of the upper surface 10a of the base substrate 10 that is not covered with the DFR is etched by a spray method using an etchant such as copper chloride or iron chloride. As result, as illustrated in FIG. 2, the trenches 10c may be formed in the upper surface 10a not to penetrate the base substrate 10, and also the post 11 may be disposed between the trenches 10c. The present disclosure is not limited thereto. The trench 10c and the post 11 may be formed by a variety of etching methods. In another embodiment, a method of coating a positive or negative photoresist without using a DFR may be employed. Furthermore, the type of an etchant may be variously changed according to a material of the base substrate 10.

As illustrated in FIG. 2, a depth of the trench 10c of the base substrate 10 may be about 80% to 90% of the thickness of the base substrate 10. In an embodiment, a remaining thickness of a portion where the trench 10c of the base substrate 10 is formed may be about 20 µm to about 40 µm.

When the remaining thickness of the portion where the trench 10c is formed is less than the above value, handling of the base substrate 10 or the semiconductor package substrate in a manufacturing process or a subsequent packaging process of the semiconductor package substrate may not be easy. Furthermore, in some cases, a through hole penetrating the upper surface 10a and the lower surface 10b of the base substrate 10 may be formed due to a tolerance during forming of the trench 10c. When the remaining thickness of the portion where the trench 10c is formed is greater than the above value, a lower circuit wiring process of patterning the lower surface 10b of the base substrate 10 later may not be easy.

Figure 3:
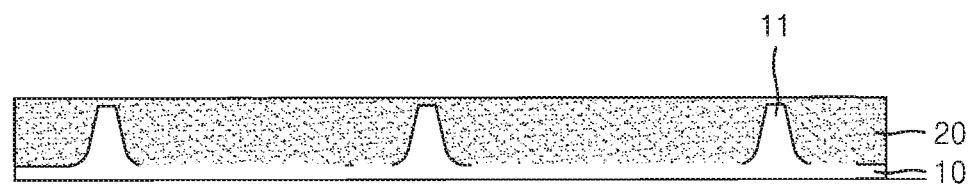

Then, as illustrated in FIG. 3, the trench 10c of the base substrate 10 is filled with resin 20. The resin 20 is an insulating material that is not electrically conductive and may include polyimide, photo solder resist (PSR), or epoxy molding composite (EMC).

In some embodiments, the resin 20 may be a thermosetting resin which is polymerized and hardened by heat treatment. In some embodiments, the resin 20 may be photosensitive resin. Filling of the resin 20 may be performed using a liquid resin material or a solid tape including a resin component. After the filling of the resin 20, a process of thermally curing the resin 20 in an oven may be performed as necessary.

Before the trench 10c of the base substrate 10 is filled with the resin 20, to make an inner surface of the trench 10c rough, a rough plating layer may be formed, or a plasma treatment, an ultraviolet treatment, or an etching process using an aqueous solution of sulfuric acid may be performed on the inside of the trench 10c. Through the above process, an adhesive force between the base substrate 10 and the resin 20 may be improved. In some embodiments, a surface roughness Ra of the inside of the trench 10c may be about 0.1 µm to about 0.5 µm. In some embodiments, the rough plating layer may be formed by an electroplating method in a copper sulfate ($CuSO_4 \cdot 5H_2O$) solution.

Figure 4:
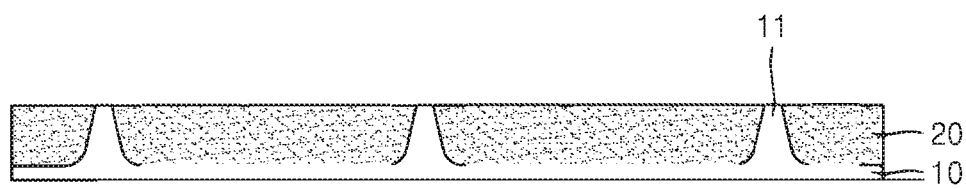

During the filling of the resin 20, as illustrated in FIG. 3, not only the trench 10c of the base substrate 10 but also at least a part of the upper surface 10a of the base substrate 10 may be covered with the resin 20. As such, when the resin 20 is overly coated, the resin 20 that is overly coated is removed by mechanical processing such as brushing, grinding, or polishing, or by chemical resin etching, and thus the resin 20 may be located only in the trench 10c of the base substrate 10, as illustrated in FIG. 4. Furthermore, when the resin 20 is a photosensitive resin, the overly filled resin is removed through the exposure and development process, and thus the resin 20 may be located only in the trench 10c. Accordingly, an upper surface of the post 11 is exposed, and the upper surface of the post 11 and an upper surface of the resin 20 may be at the same level.

Figure 5:
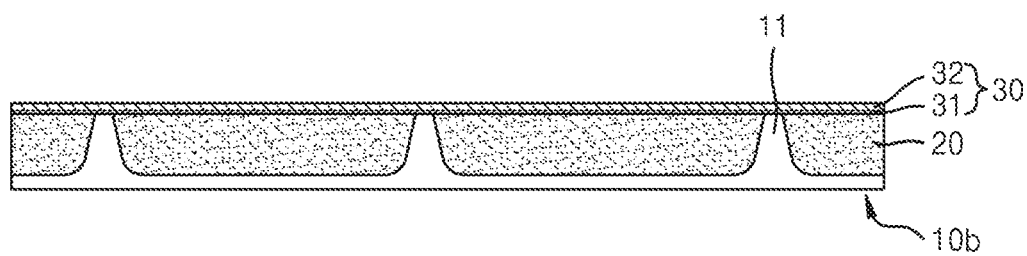

Then, as illustrated in FIG. 5, a conductive layer 30 is formed on the entire upper surface of the base substrate 10 that is filled with the resin 20. In other words, the conductive layer 30 that is formed entirely on the upper surface of the post 11 and the upper surface of the resin 20 are at the same level.

The conductive layer 30 may include a material including at least some of materials that the base substrate 10 includes. In an embodiment, when the base substrate 10 includes copper or a copper alloy, the conductive layer 30 may include copper. The conductive layer 30 as above may be formed by a sputtering method or an electroless plating method. The conductive layer 30 may be integrally formed with the upper surface of the resin 20 and the upper surface of the post 11 by the sputtering method to allow the conductive layer 30 to have a strong adhesive force with the resin 20. When the conductive layer 30 is formed by the electroless plating method, not a pure copper layer, but a conductive layer including other materials such as palladium, may be provided. As such, when the conductive layer 30 includes other materials such as palladium, an adhesive force between the conductive layer 30 and the resin 20 may decrease or become irregular. Accordingly, the conductive layer 30 is formed by the sputtering method.

The conductive layer 30 is patterned into an upper circuit wiring later to have a thickness enough to secure electrical conductivity. In some embodiments, the conductive layer 30 may be formed to have a thickness of about 10 μm to about 20 μm.

Before the conductive layer 30 is formed, to secure an adhesive force between the conductive layer 30 and the resin 20, a surface process may be performed on the upper surface of the resin 20. The surface treatment may be surface cleaning and/or a plasma treatment to increase surface roughness, which are performed on the upper surface of the resin 20 before forming the conductive layer 30. The plasma treatment may be performed using an inert gas, for example, an argon (Ar) gas, in a vacuum state.

In some embodiments, the conductive layer 30 may be formed by stacking a first conductive layer 31 and a second conductive layer 32. In this case, the first conductive layer 31 may be thinner than the second conductive layer 32, and the first conductive layer 31 may function as a seed layer of the second conductive layer 32. In some embodiments, the first conductive layer 31 may have a thickness of about several tens to several hundreds of nanometers (nm), and the second conductive layer 32 may have a thickness of about several to several tens of micrometers (um).

The first conductive layer 31 may include a material including at least some of materials that the base substrate 10 includes. In an embodiment, when the base substrate 10 includes copper or a copper alloy, the first conductive layer 31 may be formed using copper. The first conductive layer 31 as above may be formed by the sputtering method or the electroless plating method. The first conductive layer 31 that is integrally formed with the upper surface of the resin 20 and the upper surface of the post 11 may be formed by the sputtering method to allow the first conductive layer 31 to have a strong adhesive force with the resin 20. When the first conductive layer 31 is formed by the electroless plating method, not a pure copper layer, but a conductive layer including other materials such as palladium, may be provided. As such, when the first conductive layer 31 includes other materials such as palladium, an adhesive force with the resin 20 may decrease or become irregular. Accordingly, the first conductive layer 31 is formed by the sputtering method.

The second conductive layer 32 may also include at least some of the materials that the base substrate 10 includes. In an embodiment, when the base substrate 10 includes copper or a copper alloy, the second conductive layer 32 may include copper or a copper alloy.

As such, the second conductive layer 32 may be formed by a variety of methods such as the sputtering method, the electroplating method, or the electroless plating method. Since the second conductive layer 32 is thicker than the first conductive layer 31, the second conductive layer 32 may be formed by the electroplating method to have time reduction and superior characteristics.

Before the first conductive layer 31 is formed, to secure an adhesive force between the first conductive layer 31 and the resin 20, a surface treatment may be applied on the upper surface of the resin 20. The surface treatment may be surface cleaning and/or a plasma treatment to increase surface roughness of the upper surface of the resin 20 before forming the first conductive layer 31. The plasma treatment may be performed using an inert gas, for example, an argon (Ar) gas, in a vacuum state.

Figure 6:
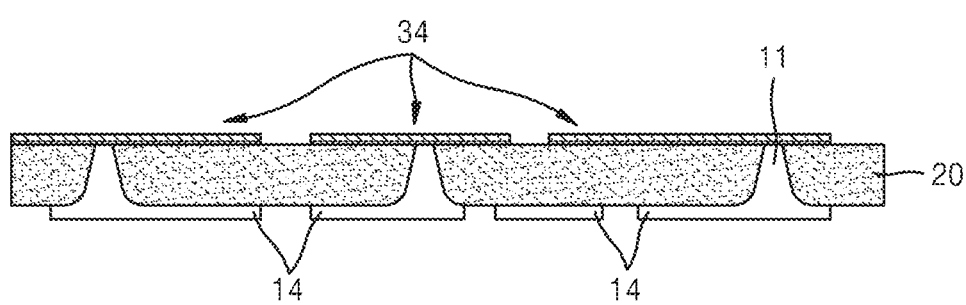

Next, as illustrated in FIG. 6, an upper circuit wiring 34 is formed by patterning the conductive layer 30, and a lower circuit wiring 14 is formed by patterning the lower surface 10b of the base substrate 10. The upper circuit wiring 34 and the lower circuit wiring 14 may be connected to an electronic device mounted on the semiconductor package substrate, and/or to an input/output terminal. In the present embodiments, since the upper circuit wiring 34 and the lower circuit wiring 14 are respectively provided on the upper surface 10a and the lower surface 10b of the base substrate 10, a degree of freedom in the design of a circuit wiring may be secured corresponding to a complex circuit wiring, for example, according to an increase in the number of input/output terminals.

In the present embodiment, the lower circuit wiring 14 and the post 11 are formed as parts of the base substrate 10, and the post 11 may be provided integrally with at least a part of the lower circuit wiring 14. A fact the post 11 that electrically connects the upper circuit wiring 34 with the lower circuit wiring 14 is integrally formed with the lower circuit wiring 14 may mean that inductance is generated less than a case in which that the post 11 and the lower circuit wiring 14 are separately provided, which signifies that a fast response is possible in terms of electricity. Furthermore, since the post 11 and the lower circuit wiring 14 are integrally formed with each other, superior heat dissipation characteristics may be obtained compared to a case in which the post 11 and the lower circuit wiring 14 are separately formed.

To form the upper circuit wiring 34, the upper surface of the conductive layer 30 is coated with photoresist (PR), exposed using a mask corresponding to the shape of the upper circuit wiring 34, and developed. Then, the conductive layer 30 may be etched to be patterned. The etching may be performed by wet etching, dry etching, or a combined etching method thereof. In some embodiments, the etching may be performed using a copper chloride etchant or an iron chloride etchant.

Likewise, to form the lower circuit wiring 14, the base substrate 10 the lower surface 10b is coated with PR, exposed using a mask corresponding to the shape of the lower circuit wiring 14, and developed. Then, the lower surface 10b of the base substrate 10 may be etched to be patterned. The etching may be performed by wet etching, dry etching, or a combined etching method thereof. In some embodiments, the etching may be performed using a copper chloride etchant or an iron chloride etchant.

In some embodiments, the upper circuit wiring 34 and the lower circuit wiring 14 may be patterned at the same time. In other words, PR is formed on each of the conductive layer 30 and the lower surface 10b of the base substrate 10 corresponding to the shapes of the upper circuit wiring 34 and the lower circuit wiring 14, and the upper circuit wiring 34 and the lower circuit wiring 14 may be patterned at the same time by wet etching.

Before the upper circuit wiring 34 and the lower circuit wiring 14 are formed, the thickness of the lower circuit wiring 14 may be adjusted by entirely etching a lower surface of the base substrate 10. As the thickness of the lower circuit wiring 14 is reduced and then patterning is performed thereon, accuracy in forming a fine pattern may be improved.

Figure 7:
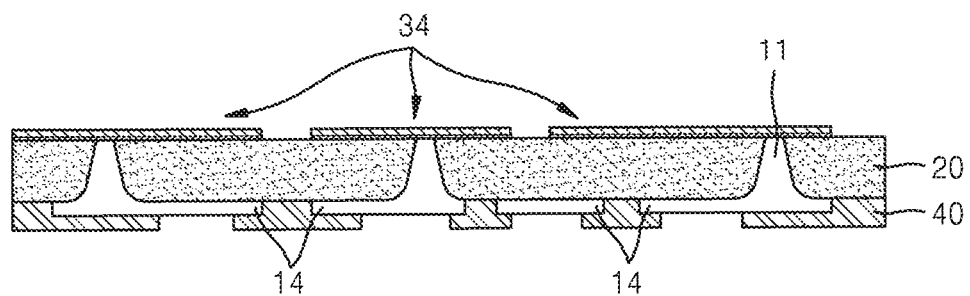

Then, additionally, after the upper circuit wiring 34 and the lower circuit wiring 14 is formed, as illustrated in FIG. 7, a circuit protection layer 40 may be formed on at least a part of the upper circuit wiring 34 and the lower circuit wiring 14.

Although FIG. 7 illustrates that the circuit protection layer 40 covers a part of the lower circuit wiring 14, the circuit protection layer 40 may cover a part of the upper circuit wiring 34. The circuit protection layer 40 may insulate to prevent a short circuit by covering at least a part of the upper circuit wiring 34 and the lower circuit wiring 14. The circuit protection layer 40 may include a material including PSR or coverlay and capable of performing insulation. The circuit protection layer 40 may be formed of photosensitive resin. In this case, the circuit protection layer 40 may be formed by a process of coating, exposure, and development. Furthermore, the circuit protection layer 40 may be formed by a direct printing method in an inkjet manner.

Figure 8:
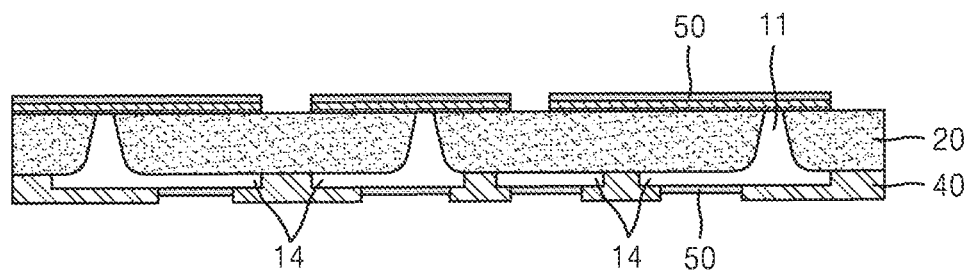

Then, additionally, as illustrated in FIG. 8, a plating layer or organic coating layer 50 may be formed in at least a part of the upper circuit wiring 34 and the lower circuit wiring 14. When the circuit protection layer 40 is formed, the plating layer or organic coating layer 50 may be formed on the upper circuit wiring 34 and the lower circuit wiring 14 that are not covered by the circuit protection layer 40.

The plating layer or organic coating layer 50 may improve an adhesive force or a solder adhesive force of wire bonding of the upper circuit wiring 34 and the lower circuit wiring 14, or may prevent oxidation thereof. When the plating layer or organic coating layer 50 is formed of a plating layer, the plating layer may be formed of palladium (Pd), gold (Au), silver (Ag), nickel (Ni), or an alloy thereof. In this case, the plating layer may be formed in electroless plating by the electroplating method or an electroless nickel electroless palladium immersion gold (ENEPIG) method.

When the plating layer or organic coating layer 50 is formed in an organic coating layer, the organic coating layer may be formed by organic solderability preservative (OSP) coating or anti-tarnish coating.

The semiconductor package substrate manufactured as above is filled with the resin 20, and includes the post 11 that penetrates through the upper circuit wiring 34 disposed on the upper surface of the resin 20, the lower circuit wiring 14 disposed on a lower surface of the resin 20, and the resin 20 and connecting the upper circuit wiring 34 with the lower circuit wiring 14. The upper circuit wiring 34 is separately provided from the post 11, and at least a part of the lower circuit wiring 14 is integrally provided with the post 11.

The post 11 and the lower circuit wiring 14 may include Cu, a Cu alloy such as Cu—Sn, Cu—Zr, Cu—Fe, or Cu—Zn, Fe, or a Fe alloy such as Fe—Ni or Fe—Ni—Co.

The upper circuit wiring 34 may be provided in a single layer or a multilayer. A part of the upper circuit wiring 34 may directly contact the post 11, and a part of the upper circuit wiring 34 may directly contact the resin 20. The upper circuit wiring 34 is connected to an electronic apparatus and/or an input/output terminal mounted on an upper surface of the semiconductor package substrate. The post 11 electrically connects the upper circuit wiring 34 with the lower circuit wiring 14. The entire area of the upper circuit wiring 34 may be greater than an area of the upper surface of the post 11.

In some embodiments, since the upper circuit wiring 34 and the lower circuit wiring 14 are respectively provided on the upper surface 10a and the lower surface 10b of the base substrate 10, a degree of freedom of designing a circuit wiring may be secured corresponding to a complex circuit wiring according to an increase in the number of input/output terminals.

In the present embodiment, the lower circuit wiring 14 and the post 11 are formed as a part of the base substrate 10, and thus the post 11 may be integrally formed with at least a part of the lower circuit wiring 14. A fact the post 11 that electrically connects the upper circuit wiring 34 with the lower circuit wiring 14 is integrally formed with the lower circuit wiring 14 may mean that inductance is generated less than a case in which that the post 11 and the lower circuit wiring 14 are separately provided, which signifies that a fast response is possible in terms of electricity. Furthermore, since the post 11 and the lower circuit wiring 14 are integrally formed, superior heat dissipation characteristics may be obtained compared to a case in which the post 11 and the lower circuit wiring 14 are separately formed.

Figure 9:
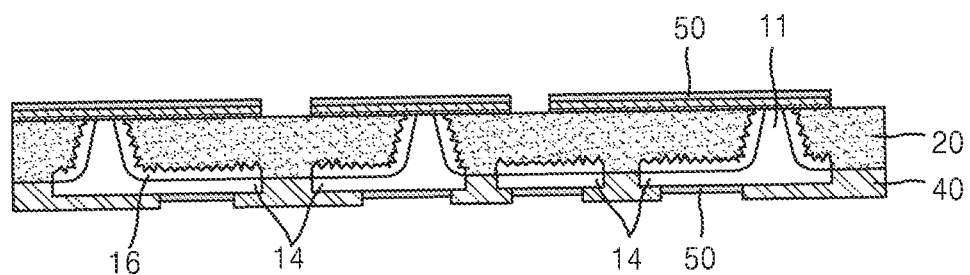
FIG. 9 is a cross-sectional view of a semiconductor package substrate according to another embodiment.

FIG. 9 is a cross-sectional view schematically illustrating a part of a semiconductor package substrate manufactured by a method of manufacturing a semiconductor package substrate according to another embodiment. As illustrated in FIG. 9, a rough plating layer 16 may be formed in the trench 10c of the base substrate 10. The rough plating layer 16 may increase surface roughness of the inside of the trench 10c, and thus an adhesive force between the base substrate 10 and the resin 20 may be improved.

The rough plating layer 16 may be formed to have a surface roughness of about 0.1 μm to about 0.5 μm, and may have an improved adhesive force with the resin 20 by an anchoring effect. The rough plating layer 16 may be formed of copper (Cu), and may be formed in a copper sulfate ($CuSO_4.5H_2O$) solution by the electroplating method.

As described above, in the present embodiment, without forming the rough plating layer 16, by performing a plasma treatment, an ultraviolet treatment, or an etching treatment on the inside of the trench 10c, the surface roughness of the inside of the trench 10c may be increased, and thus an adhesive force with respect to the resin 20 may be improved.

In the embodiment of FIG. 9, like the previous embodiments, since the upper circuit wiring 34 and the lower circuit wiring 14 are respectively provided on the upper surface 10a and the lower surface 10b of the base substrate 10, a degree of freedom of designing a circuit wiring may be secured corresponding to a complex circuit wiring according to an increase in the number of input/output terminals.

Furthermore, the lower circuit wiring 14 and the post 11 are formed as a part of the base substrate 10, and the post 11 may be integrally formed with at least a part of the lower circuit wiring 14. As the post 11 that electrically connects the upper circuit wiring 34 to the lower circuit wiring 14 is integrally formed with the lower circuit wiring 14, less inductance is generated than in a case in which that the post 11 and the lower circuit wiring 14 are separately provided. Accordingly, the semiconductor package substrate may have a fast response. Furthermore, since the post 11 and the lower circuit wiring 14 are integrally formed, superior heat dissipation characteristics may be obtained compared to a case in which the post 11 and the lower circuit wiring 14 are separately formed.

As described above, according to the above-described embodiments, a method of manufacturing a semiconductor package substrate having fast response and superior heat dissipation characteristics and having circuit redistribution on both of upper and lower surfaces, and a semiconductor package substrate manufactured using the method, may be implemented. The scope of the present disclosure is not limited by the above effects.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A semiconductor package substrate, comprising:
   a resin including a penetrating hole;
   an upper circuit wiring disposed on an upper surface of the resin;
   a lower circuit wiring disposed on a lower surface of the resin; and
   a post filling the penetrating hole and connecting the upper circuit wiring to the lower circuit wiring;
   wherein at least part of the lower circuit wiring and the post are part of a same single layer, the upper circuit wiring is part of an additional layer that is different from the single layer, and the upper surface of the post and the upper surface of the resin are at a same level.

2. The semiconductor package substrate of claim 1, wherein the upper circuit wiring includes a first conductive layer and a second conductive layer on the first conductive layer, and a thickness of the first conductive layer is less than a thickness of the second conductive layer.

3. The semiconductor package substrate of claim 1, wherein the resin includes a photosensitive resin.

4. The semiconductor package substrate of claim 1, wherein the post includes copper or a copper alloy.

5. The semiconductor package substrate of claim 1, further comprising a circuit protection layer covering at least a part of the lower circuit wiring.

6. The semiconductor package substrate of claim 1, further comprising a plating layer or organic coating layer on at least a part of the upper circuit wiring.

7. A semiconductor package substrate filled with resin, the semiconductor package substrate comprising:
   an upper circuit wiring disposed on an upper surface of the resin;
   a lower circuit wiring disposed on a lower surface of the resin;
   a post penetrating the resin and connecting the upper circuit wiring to the lower circuit wiring, and
   a rough plating layer disposed between the resin and the post,
   wherein the upper circuit wiring is separate from the post, and at least a part of the lower circuit wiring is integrally formed with the post.

8. The semiconductor package substrate of claim 7, wherein the rough plating layer has a surface roughness of 0.1 μm to about 0.5 μm.

9. The semiconductor package substrate of claim 7, wherein the upper circuit wiring includes a first conductive layer and a second conductive layer on the first conductive layer, and a thickness of the first conductive layer is less than a thickness of the second conductive layer.

10. The semiconductor package substrate of claim 7, wherein the resin includes a photosensitive resin.

11. The semiconductor package substrate of claim 7, wherein the post includes copper or a copper alloy.

12. The semiconductor package substrate of claim 7, further comprising a circuit protection layer covering at least a part of the lower circuit wiring.

13. The semiconductor package substrate of claim 7, further comprising a plating layer or organic coating layer on at least a part of the upper circuit wiring.

14. The semiconductor package substrate of claim 1, further comprising a rough plating layer disposed between the resin and the post.

15. The semiconductor package substrate of claim 14, wherein the rough plating layer has a surface roughness of 0.1 μm to about 0.5 μm.

16. A semiconductor package substrate filled with resin, the semiconductor package substrate comprising:
   a post penetrating the resin;
   a first circuit wiring disposed on a planar surface defined by a first surface of the resin and a first end of the post; and
   a second circuit wiring disposed on a second opposite surface of the resin; wherein:
      at least a part of the second circuit wiring is integral with a second end of the post; and
      a lower surface of the first circuit wiring, the first surface of the resin and the first end of the post are at a same level.

17. The semiconductor package substrate of claim 16, wherein the post includes copper or a copper alloy.

18. The semiconductor package substrate of claim 16, further comprising a circuit protection layer covering at least a part of the second circuit wiring.

19. The semiconductor package substrate of claim 16, further comprising a plating layer or organic coating layer on at least a part of the first circuit wiring.

20. The semiconductor package substrate of claim 16, wherein:
   at least part of the second circuit wiring and at least part of the post are part of a same single layer; and
   the resin includes a photosensitive resin.

21. The semiconductor package substrate of claim 1, the upper circuit wiring is directly connected to the post at a portion corresponding to the penetrating hole.

* * * * *